United States Patent
Vystavel et al.

(10) Patent No.: US 9,741,527 B2
(45) Date of Patent: Aug. 22, 2017

(54) SPECIMEN HOLDER FOR A CHARGED PARTICLE MICROSCOPE

(71) Applicant: FEI Company, Hillsboro, OR (US)

(72) Inventors: Tomas Vystavel, Brno (CZ); Josef Sestak, Breclav (CZ); Pavel Poloucek, Brno (CZ); Lubomir Tuma, Brno (CZ); Michal Hrouzek, Brno (CZ); Tomas Trnkocy, Brno (CZ); Martin Cafourek, Trebic (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/977,436

(22) Filed: Dec. 21, 2015

(65) Prior Publication Data
US 2016/0181059 A1    Jun. 23, 2016

(30) Foreign Application Priority Data
Dec. 22, 2014    (EP) .................... 14199616

(51) Int. Cl.
*H01J 37/20*    (2006.01)
*H01J 37/26*    (2006.01)
*H01J 37/16*    (2006.01)

(52) U.S. Cl.
CPC .............. *H01J 37/16* (2013.01); *H01J 37/20* (2013.01); *H01J 37/26* (2013.01);
(Continued)

(58) Field of Classification Search
CPC .. H01J 37/20; H01J 37/26; H01J 37/09; H01J 37/16; H01J 37/185; H01J 37/22;
(Continued)

(56) References Cited

U.S. PATENT DOCUMENTS

| 5,225,683 A * | 7/1993 | Suzuki | H01J 37/20 250/442.11 |
| 5,280,178 A * | 1/1994 | Engelen | H01J 37/20 250/440.11 |

(Continued)

FOREIGN PATENT DOCUMENTS

| GB | 1400467 | 7/1975 |
| JP | S6244942 | 2/1987 |
| JP | 2001066231 | 3/2001 |

OTHER PUBLICATIONS

"Electron Microscope", Wikipedia, Accessed Oct. 15, 2015, 11 pages. <https://en.wikipedia.org/wiki/Electron_microscope>.
(Continued)

*Primary Examiner* — David A Vanore
(74) *Attorney, Agent, or Firm* — Scheinberg & Associates, P.C.; Michael O. Scheinberg

(57) ABSTRACT

A specimen holder for a Charged Particle Microscope is disclosed. The holder has a support structure with an elongated member including a specimen mounting zone. The specimen mounting zone comprises a rotor with an axis perpendicular to the elongated member with a paddle connected to it which may be rotated. Specimens may be mounted on the paddle so that rotation of the paddle allows specimens to be rotated and/or inverted for microscopic observation on both sides. Specimens may either be directly mounted on the paddle, or on a grid, half-moon grid, lift-out grid, aperture frame, dielectric film, etc.

20 Claims, 6 Drawing Sheets

(52) U.S. Cl.
CPC ... *H01J 2237/202* (2013.01); *H01J 2237/204* (2013.01); *H01J 2237/206* (2013.01); *H01J 2237/2007* (2013.01); *H01J 2237/20207* (2013.01); *H01J 2237/20214* (2013.01); *H01J 2237/20278* (2013.01)

(58) Field of Classification Search
CPC ....... H01J 37/28; G01N 23/04; G01N 23/046; G01N 23/06
USPC .............. 250/442.11, 440.11, 307, 310, 311, 250/441.11, 306, 396 R, 397, 398
See application file for complete search history.

(56) References Cited

U.S. PATENT DOCUMENTS

| | | | | |
|---|---|---|---|---|
| 6,388,262 | B1 * | 5/2002 | Alani | H01J 37/20 250/442.11 |
| 7,566,884 | B2 * | 7/2009 | Deguchi | G01N 23/06 250/310 |
| 7,705,324 | B2 * | 4/2010 | Miyazaki | H01J 37/20 250/311 |
| 7,772,567 | B2 * | 8/2010 | Kato | G01N 23/04 250/440.11 |
| 7,800,077 | B2 * | 9/2010 | Moriya | H01J 37/20 250/440.11 |
| 7,863,564 | B2 * | 1/2011 | Tsuneta | H01J 37/20 250/306 |
| 8,089,053 | B1 * | 1/2012 | Finch | H01J 37/20 250/440.11 |
| 9,147,551 | B2 * | 9/2015 | Luecken | H01J 37/20 |
| 2007/0023684 | A1 * | 2/2007 | Lewis | H01J 37/20 250/442.11 |
| 2008/0173813 | A1 * | 7/2008 | Van De Water | G01N 23/04 250/307 |
| 2008/0210869 | A1 | 9/2008 | Gerritsen et al. | |
| 2008/0296498 | A1 | 12/2008 | Hong | |
| 2009/0127474 | A1 | 5/2009 | Tsuneta et al. | |
| 2011/0253905 | A1 * | 10/2011 | Moebus | G21K 7/00 250/441.11 |
| 2013/0248354 | A1 | 9/2013 | Keady et al. | |
| 2014/0145077 | A1 | 5/2014 | Schoenmakers et al. | |
| 2014/0353500 | A1 * | 12/2014 | Tsuneta | H01J 37/20 250/311 |
| 2014/0361165 | A1 | 12/2014 | Hlavenka et al. | |
| 2015/0069231 | A1 | 3/2015 | Luecken et al. | |
| 2016/0181059 | A1 * | 6/2016 | Vystavel | H01J 37/16 250/307 |

OTHER PUBLICATIONS

"Scanning Electron Microscope", Wikipedia, Accessed Oct. 15, 2015, 18 pages. <https://en.wikipedia.org/wiki/Scanning_electron_microscope>.

"Transmission Electron Microscopy", Wikipedia, Accessed Oct. 15, 2015, 23 pages. <https://en.wikipedia.org/wiki/Transmission_electron_microscopy>.

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Helium_Ion_Microscope>.

W. H. Escovitz et al., "Scanning Transmission Ion Micoscope wth a Field Ion Source", Proc. Nat. Acad. Sci. USA, vol. 72, No. 5, pp. 1826-1828, May 1975, 3 pages.

"TEM Grids Overview", Ted Pella, Inc., Accessed Dec. 21, 2015, 2 pages. <http://www.tedpella.com/grids_html/grids.htm>.

* cited by examiner

SPECIMEN HOLDER FOR A CHARGED PARTICLE MICROSCOPE

BACKGROUND OF THE INVENTION

Field of the Invention

The invention relates to a specimen holder for a Charged Particle Microscope, and in particular to specimen holders with improved versatility and a larger number of degrees of freedom of motion.

Description of the Related Art

The invention relates to a Charged Particle Microscope comprising such a specimen holder, and to a method of using such a Charged Particle Microscope.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various subspecies, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
  en.wikipedia.org/wiki/Electron_microscope
  en.wikipedia.org/wiki/Scanning_electron_microscope
  en.wikipedia.org/wiki/Transmission_electron_microscopy
  en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
  en.wikipedia.org/wiki/Scanning_Helium_Ion_Microscope
  W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photomultipliers (including solid state photomultipliers, SSPMs), photodiodes, CMOS detectors, CCD detectors, photovoltaic cells, etc., which may, for example, be used in conjunction with a scintillator film, for instance.

In the case of a transmission-type microscope (such as a (S)TEM, for example), the CPM will also comprise:
- An imaging system, which essentially takes charged particles that are transmitted through a specimen (plane) and directs (focuses) them onto analysis apparatus, such as a detection/imaging device, spectroscopic apparatus (such as an EELS module), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy. However, such simplification is intended solely for clarity/illustrative purposes, and should not be interpreted as limiting.

A specimen under investigation in a CPM is generally located in a very cramped space, in very close proximity to the terminal optical elements of the CPM's illuminator. In the case of a dual-beam CPM, this situation is exacerbated by the fact that there are two optical columns—e.g. one for electrons and one for ions—which converge (from different directions) at the specimen, thereby causing even greater cramping. In addition, the CPM may employ a gas injection system and/or micromanipulator(s), which will further crowd the vicinity of the specimen. In the case of a transmission-type CPM, available space is even more confined, since the first optical elements of the imaging system are located just below the specimen. Such cramped conditions have led to the development of rod-like specimen holders, on which a specimen mounting zone is located at/near one extremity (second end) of a relatively thin elongated member, which is fine enough to be introduced laterally (so called "side entry") into the cramped specimen space described above. The other extremity (first end) of this elongated member is connected to a support structure (e.g. a simple structure such as a knob or handle, or a composite structure comprising, for example, a dewar for containing a cryogenic coolant), and this support structure is generally intended to remain outside a retaining wall of the CPM's vacuum enclosure while said connected elongated member protrudes through an aperture in said wall. In many such cases, a portion of the elongated member inside the CPM will seat into a cradle that is connected to an actuator system (e.g. the so-called CompuStage in TEMs supplied by FEI Company), allowing the elongated member (and a specimen mounted thereon) to be positioned/moved in multiple degrees of freedom relative to the/an optical axis of the CPM. To aid clarity, a Cartesian coordinate system will be adhered to in this discussion, in which:

The (longitudinal axis of the) elongated member extends along the X direction;

The/an optical axis of interest in a particular investigation extends (temporarily) along the Z direction.

In such a system, said actuated cradle will, for example, be positionable in X, Y, Z. It will also often be positionable in Rx (rotation about X, also called alpha tilt or roll), e.g. so as to allow a tilt series (sinogram) to be acquired during (TEM) tomography. In multi-beam (e.g. dual-beam) CPMs in which a plurality of particle-optical axes (co-planar in a plane O) converge on a specimen space, the elongated member of the specimen holder is conventionally arranged to as to extend perpendicular to O; in this way, Rx (alpha tilt) positioning can be used to "present" an exposed surface of a clamped specimen to a given particle-optical axis, at will.

In addition to imaging, an important aspect of working with a CPM is specimen preparation. This is particularly (though not exclusively) the case in transmission-type CPMs, in which the specimen will generally be extremely thin (e.g. of the order of 1-100 nm), consequently relatively brittle/delicate, and therefore (very) difficult to work with. Once such a specimen is (precariously) mounted on the (specimen mounting zone of the) holder (e.g. using adhesive, or a mechanical clamping mechanism such as a clip, flange, screw, etc.), it is highly desirable not to have to demount it until strictly necessary. Nevertheless, after mounting, many operations (alterations, finishing) may have to be performed on the specimen, such as ion milling, ion-beam-induced deposition (IBID), electron-beam-induced deposition (EBID), etc., for purposes of thinning, surface modification, etc. Many such functionalities can be made available in situ in a CPM, but their applicability/usefulness is limited in many situations by sub-optimal manipulability of the specimen holder. In this context, the current inventors have worked extensively to identify shortcomings in conventional holder designs, and to address these effectively so as to produce better performance. The results of this endeavor are the subject of the current invention.

BRIEF SUMMARY OF THE INVENTION

It is an object of the invention to provide an improved specimen holder of the type set forth above. In particular, it is an object of the invention that such a specimen holder should have enhanced versatility compared to prior-art holders.

These and other objects are achieved in a specimen holder as set forth in the opening paragraph above, characterized in that said specimen mounting zone comprises:

A rotor that is rotatable about a transverse axis extending substantially perpendicular to said longitudinal axis;

A paddle connected to said rotor so as to be rotatable about said transverse axis, the paddle comprising a specimen mounting area;

Driving means connected to said rotor, which can be invoked to rotate said paddle through a rotational range that allows the paddle to be inverted relative to an initial orientation thereof.

To aid in understanding the invention, the following should be noted:

With reference to the coordinate system introduced above, the transverse axis in the inventive specimen holder can be regarded as extending along the Y direction, whence the driving means produce Ry positioning (rotation about Y, also called beta tilt or pitch); the X axis may be regarded as a "master" axis and the Z and Y axis may be regarded as "subordinate" axes in that, if the elongated member is rotated about its longitudinal axis (Rx, alpha tilt), then the Z and Y axes will co-rotate with it.

According to the invention, the achievable rotational range (extent, amplitude) of the Ry (beta tilt) functionality is such as to allow the paddle (and a specimen mounted thereon) to be "flipped over", so as to be able to alternately present both a front side and a back side thereof to a reference direction—which in many practical applications will be the Z direction (aligned along the propagation direction of a charged-particle beam), though, for example, another reference direction in the ZX plane is also conceivable. To this end, said rotational range will nominally be 180 degrees or more, although a range less than 180 degrees (and more than, say, 120 degrees) will, in principle, also be enough to allow the paddle/specimen to be—at least partially—inverted (turned upside down). Apart from being invertible in this manner, the paddle can, of course, be set to a whole range of intermediate beta-tilt orientations.

The rotor referred to here may, for example, be:

A rotatable axle/shaft that extends along the transverse axis through a major plane of the paddle or parallel to a major surface thereof;

A rotatable stub/hub/collar/flange that is attached to an edge of the paddle, etc. The skilled artisan will grasp this point, and be able to choose a rotor type/configuration that is tailored to the particulars of a given paddle/holder design.

Before proceeding with a further discussion of the invention, it should be noted that, although a specimen (e.g. lamella, chunk, etc.) may be directly mounted on the specimen mounting area of the paddle (plate), it will often be indirectly mounted thereon via an intermediary structure, such as a grid, half-moon grid, lift-out grid, aperture frame, Quantifoil® substrate, dielectric support film, etc. —for instance of types such as described in the following link:

www.tedpella.com/grids_html/grids.htm

Typically, the specimen will be mounted so that at least a portion of it will lie in a plane that is be substantially parallel to a major plane of the paddle, although this does not necessarily have to be the case. As alluded to above, attachment of the specimen/intermediary structure to the paddle's specimen mounting area may, for example, occur using adhesive or mechanical clamping means.

To explain the invention in more detail, consider an illustrative example in which (at least a portion of) the aforementioned paddle has (substantially) the form of a relatively flat rectangular plate/block. With reference to the previously introduced coordinate system, one can introduce the following labelling:
  Front side and back side: the major surfaces of the paddle separated from one another along the Z direction. These can also be referred to as the "Z sides".
  Left side and right side: the sides/edges of the paddle separated from one another along the Y direction (transverse direction). These can also be referred to as the "Y sides".
  Leading side and trailing side: the sides/edges of the paddle separated from one another along the X direction (longitudinal direction). These can also be referred to as the "X sides".

The same labelling can be used to refer to the various (corresponding) sides of a specimen mounted on the paddle. On the basis of this labelling, a major advantage of the inventive specimen holder is that its large-range beta tilt functionality allows sequential access to front and back surfaces (Z sides) of a specimen while keeping a given Y side of the specimen presented in a constant direction. This aspect of the invention is important inter alia in view of the fact that many of the intermediary structures (for specimen mounting) referred to above (e.g. half-moon grids) are asymmetric, and often expose/present one side of a specimen while obscuring/overshadowing an opposite side; in such cases, it is important to be able to continually access the specimen (e.g. for ion milling/thinning purposes) from the same exposed side. To give a practical example, the inventive specimen holder allows front and back surfaces (Z sides) of a so-called "lamella" specimen to be alternately imaged using a SEM or TEM column while constantly presenting a given Y side to a FIB column, e.g. for purposes of controlled two-sided thinning with accurate end-point detection. In contrast, if—as in the case of a prior-art specimen holder—a specimen could only be turned back-to-front using alpha tilt (Rx) functionality, then this would simultaneously result in a left-to-right switch; consequently, a Y side that was originally pointing toward a FIB column (for example) would now be pointing away from it.

In a particular embodiment of the invention, the following applies:
  Said longitudinal (X) and transverse (Y) axes are located in a reference (XY) plane;
  Said transverse (Y) axis intersects said paddle at a first edge (Y1) of the paddle;
  A second edge (Y2) of the paddle, opposite said first edge (Y1), is at least partially accessible without obstruction within said reference (XY) plane.

In such a set-up, the paddle is essentially cantilevered on the rotor at one Y side (Y1), but is unobstructed (e.g. by a support frame associated with the rotor) at the opposite Y side (Y2); in other words, the paddle is suspended within a frame that has an opening (or is completely open) on one side (Y2). In this way, it is (for example) possible to:
  Access the front and back Z sides of a specimen using an extreme-grazing-incidence beam (at a very small glancing angle) arriving from said unobstructed side (Y2); and/or
  Access the unobstructed Y side/face (Y2) of the specimen from within the reference (XY) plane, e.g. when one wants to perform edge milling with an ion beam.

An example of such an embodiment is illustrated in FIGS. 2 and 3, for instance.

In another embodiment of the invention, said paddle is detachably connected to said rotor via a releasable coupling. Such a set-up allows a given paddle—on which a particular specimen has been (painstakingly) mounted/prepared—to be interchanged between different (types of) specimen holder and/or to be stored in situ in a specimen library (e.g. cassette, cabinet, rack, etc.), for example, without having to demount the specimen. It also allows different types, shapes or sizes of paddle to be used in conjunction with a given specimen holder. The mechanism of the detachable connection that allows such reversible release may, for example, employ (a variant/modification/miniaturization of):
  A bayonet coupling;
  A sprung lip that interlocks with a retaining flange (similar to that used in click connectors for garden hoses, for instance);
  A hydraulic or pneumatic pressure coupling;
  A screwed, bolted or clipped joint,
etc.

An embodiment such as that set forth in the previous paragraph can be further enhanced if the paddle is provided with a gripping interface that allows it to be mounted to and demounted from said rotor using a mechanical gripper tool. Such a gripping interface may, for example, comprise one or more recesses, grooves, lips, pips, etc., that engage with corresponding features of a mechanical gripping tool (which may, for example, comprise tweezers, pliers, a claw, vice-grip, etc.) to allow the tool to firmly grip the paddle during attachment to/detachment from the rotor, and/or during transport, storage, etc. A mechanical gripping tool of this type may, for example, be:
  Manually operated, such as in the case of a manipulator arm with one end (gripper tool) inside an enclosure (such as the vacuum/environmental enclosure of a CPM, an airlock, a fume cupboard, etc.) and another end outside said enclosure, whereby passage through the enclosure occurs via a compliant joint such as a (metallic) bellows, for instance. An example of such a manipulator arm is a so-called "wobble stick".
  Machine-operated, such as in the case of a SCARA robot arm, or other type of (articulated) robot arm, that is electrically, pneumatically and/or hydraulically driven, for example, and that can be programmed to work in an automatic/autonomous manner so as to perform handling/transport tasks according to a command list.

The presence/use of such a gripping interface on the paddle helps prevent damage to the specimen holder, and more specifically to the paddle and/or a specimen mounted thereon, in that it helps prevent unintended slippage/overshoot when coupling/decoupling and transporting the paddle.

As regards the driving means used to rotate the rotor so as to produce beta tilt (Ry) of the paddle, such driving means can take various different possible forms. For example:
  A small electric motor (such as a stepper motor, piezoelectric actuator, voice coil motor, etc.) could be used in situ to directly drive the rotor. Such an approach could, however, be regarded as potentially unattractive because of:
    The space required to locate such a motor at the specimen mounting zone of the holder, which—as already set forth above—typically needs to be able to fit into very confined volumes;
    The stray electric/magnetic fields potentially produced by such a motor, which could adversely affect operation of a CPM in which the holder was employed.

An in situ pneumatic or hydraulic actuator head, with a fluid line connected to a remote pump/pressurizer/controller. However, once again, the actuator head in such a construction might be regarded as occupying too much volume when using the holder in cramped spaces. In addition, the rotational positioning accuracy attainable with such fluid-driven actuation could, for certain applications, be considered sub-optimal.

However, the inventors have developed a particular embodiment of the invention in which the driving means comprise:

A driving wheel connected to said rotor;

An actuator located remote from said rotor;

Connecting means connecting said actuator to said driving wheel, which connecting means comprise a tensioned driving belt.

As here employed, the term "belt" should be broadly interpreted as encompassing a wire, cable, band, chain, etc. An advantage of such an approach is that the actuator is located ex situ (i.e. distal/removed from the direct locality of the rotor), thus addressing the abovementioned issues regarding available space and the disturbing effect of stray/parasitic fields. Another advantage is that such a set-up allows relatively high rotational positioning accuracy (e.g. of the order of about 0.1 degrees) to be reproducibly and reliably achieved, since effects such as hysteresis and mechanical play are mitigated/eliminated. In addition to the referenced driving belt, the connecting means may, if desired, also comprise additional components, such as a transmission rod/cable, driving screw, etc. An example of such an embodiment is illustrated in FIG. 5.

In terms of materials choice for the inventive specimen holder, the skilled artisan will understand that he can select from various options. Holders of this type are typically (largely) made of metal (such as a copper alloy, or aluminum, for example), but this does not preclude the use of other materials, such as ceramics/vitreous materials, polymers, etc.

Summarizing some of the advantages of the invention, it is seen that:

The inventive holder is highly versatile, and allows improved connectivity/compatibility between various (different types of) CPMs, specimen preparation chambers, specimen storage chambers, etc.

The large-range beta-tilt functionality of the invention greatly facilitates accurate in situ preparation, mounting and machining of specimens in a CPM, particularly in complex situations involving specific interchange/orientation requirements of a specimen relative to an array of different components, such as an electron beam, ion beam, micromanipulator and gas injection nozzle/beam-induced welding device.

The detachable paddle functionality facilitates (automated) specimen transfer and storage, with a minimal need to break vacuum.

BRIEF DESCRIPTION OF THE SEVERAL VIEWS OF THE DRAWINGS

The invention will now be elucidated in more detail on the basis of exemplary embodiments and the accompanying schematic drawings, in which.

In the Figures, where pertinent, corresponding parts may be indicated using corresponding reference symbols.

DETAILED DESCRIPTION OF PREFERRED EMBODIMENTS

Embodiment 1

Figure 1:
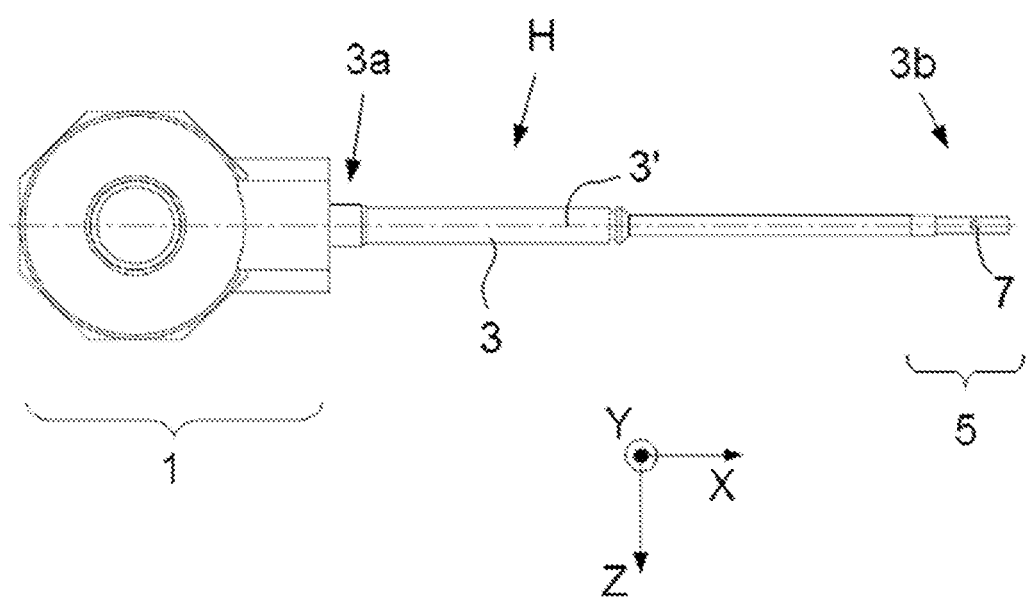
FIG. 1 renders a (simplified) rear view of part of an embodiment of a specimen holder according to the current invention.

FIG. 1 renders a (simplified) rear view of part of an embodiment of a specimen holder H according to the current invention, and comprising the following components:

1: A support structure, such as a knob, handle, etc. If desired, this may also comprise a vessel for containing a coolant/cryogenic fluid (such as liquid nitrogen, for example) for the purpose of keeping the holder H—and a specimen S mounted thereon—at a reduced/cryogenic temperature. The support structure 1 can, for example, (partly) be made of metal, ceramic or plastic.

3: An elongated member (arm/rod/finger/shaft), which may, for example, be (largely) made of a metallic material, such as bronze, stainless steel, titanium, etc. This has a first end 3a that is connected to the support structure 1, and a second end 3b that comprises a specimen mounting zone 5. The elongated member 3 has a longitudinal axis 3' (essentially a cylindrical axis) that extends along its length between said first end 3a and second end 3b; as here depicted, this longitudinal axis 3' extends parallel to the X direction of the illustrated Cartesian coordinate system. When in use inside the (vacuum) enclosure E of a CPM (or other apparatus, such as an airlock, for example), the holder H can be mounted so that the support structure 1 remains outside enclosure E, whereas the elongated member 3 protrudes through an aperture in the enclosure E and seats within a cradle A' that is actuated by a stage A (see FIG. 6); such a stage A can typically position the cradle A' and holder H—and particularly the specimen mounting zone 5 and a specimen S mounted thereupon—in multiple degrees of freedom, such as X, Y, Z and Rx (alpha tilt).

5: Said specimen mounting zone, which is a region at/proximal the end 3b of the elongated member 3 where a specimen is intended to be mounted. As here depicted, this specimen mounting zone 5 is somewhat tapered/flattened relative to the rest of the elongated member 3 (see also FIGS. 2, 3 and 5), though this does not necessarily have to be the case. Visible in the rear view of FIG. 1 is (part of) a rotor 7, which is more clearly visible in FIG. 4. This rotor 7 is rotatable about a transverse axis 7' (see FIGS. 2-5) that extends substantially perpendicular to the longitudinal axis 3' of the elongated member 3; as here illustrated, the transverse axis 7' extends parallel to the Y direction. This rotor 7 may, for example, be embodied as an axle that can rotate in a bore, or that is mounted within a miniature bearing chase, for instance, and will be discussed in more detail below.

Figure 2:
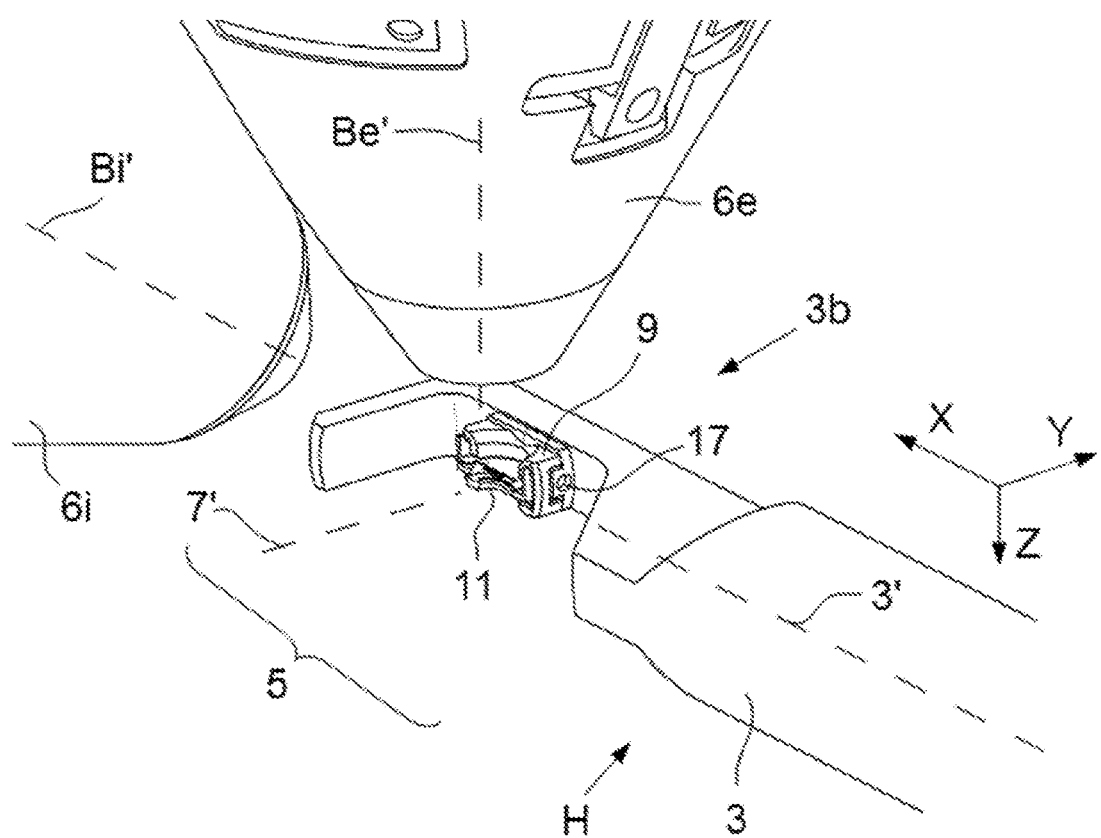
FIG. 2 renders a magnified perspective view of part of the holder of FIG. 1, located inside (an embodiment of) a dual-beam charged-particle microscope.
Figure 3:
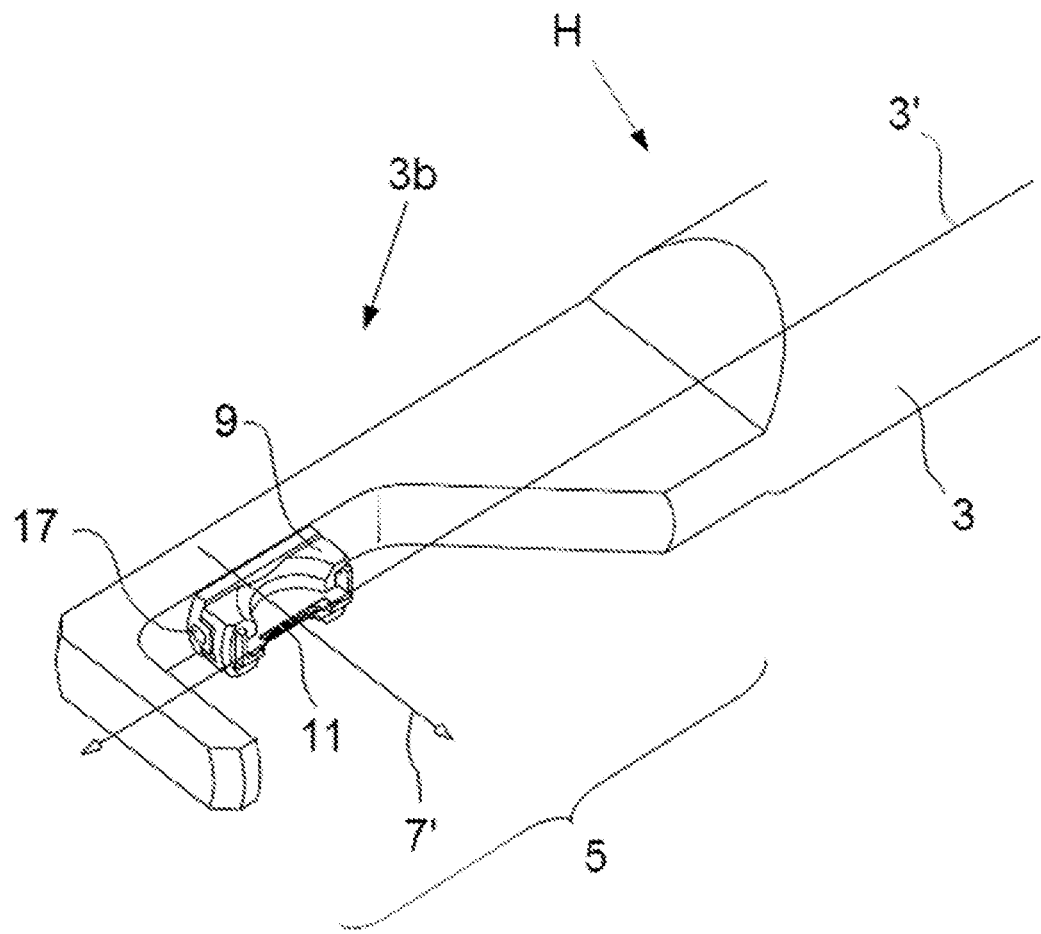
FIG. 3 renders a view of the holder of FIG. 2 from a different perspective.
Figure 4:
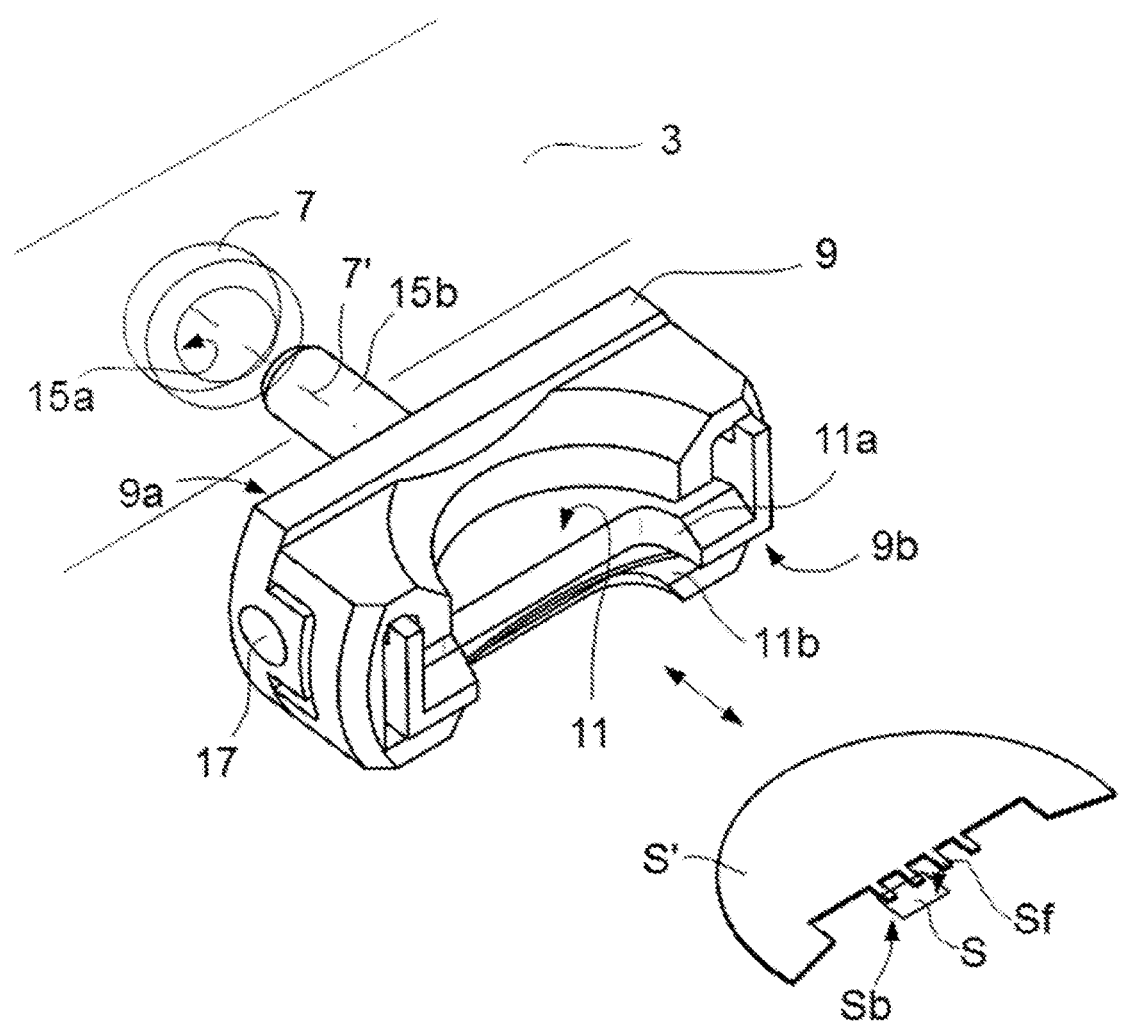
FIG. 4 renders a magnified exploded view of part of the holder of FIG. 3.

Turning now to FIGS. 2-4, these reveal the following components:

9: A paddle that is (detachably) connected to the rotor 7 (see FIG. 4, in particular) so as to be rotatable about transverse axis 7' (Ry, or beta tilt). To this end, the rotor 7 and paddle 9 have cooperating/complementary coupling means 15a, 15b, respectively; as here depicted, a stub/protrusion 15b on the paddle 9 engages with an inner surface 15a of annular rotor 7, e.g. via a click or sprung coupling, or a simple friction fit, for instance. The paddle 9 is essentially a (quasi-)flat body (e.g. comprising metal or ceramic) that is provided with a specimen mounting area 11. This specimen mounting area 11 can take many different forms, but is here embodied as a relatively tapered/thinned area of the paddle 9 with cooperating (sprung) jaws 11a, 11b; between these jaws 11a, 11b, a specimen S—or an intermediary structure S', such as the illustrated half-moon grid—can be (removable) mounted. Note that, as here shown, the paddle 9 is attached (cantilevered) to the rotor 7 at only one side/edge 9a, whereas the oppositely located side/edge 9b (at which specimen mounting area 11 is located) is free-hanging/unobstructed/exposed; in this way, the paddle 9—and a specimen S mounted thereon—can be freely accessed from one side (opposite edge 9a) within the XY (reference) plane (see FIGS. 2 and 3).

With specific reference to FIG. 2 (see FIGS. 6 and 4 also), the following is illustrated:

6e: The "nose"/terminal particle-optical element of the illuminator of an electron-optical column; in use, a beam of electrons propagates along particle-optical axis Be'.

6i: Analogously, the nose/terminal particle-optical element of the illuminator of an ion-optical column; in use, a beam of ions propagates along particle-optical axis Bi'.

Note that the holder H is typically inserted/positioned so that a specimen S mounted on the paddle 9 is located substantially at/proximal a point of intersection of particle-optical axes Be' and Bi'. By rotating the holder H about longitudinal axis 3' (Rx, alpha tilt), a mounted specimen S can be "presented" at will to (for example) nose 6e or 6i, i.e. a particular surface of the specimen S (such as "front" surface Sf) can be aligned so as to be (for example) substantially perpendicular to axis 6e' or 6i', respectively.

In addition to such alpha tilt functionality, the inventive specimen holder H also provides large-range beta tilt (Ry) functionality, allowing a mounted specimen S to be inverted/flipped over about the transverse axis 7'; in this way, one can, for example, invert the paddle 9 so that, having initially presented front surface Sf of specimen S to (for example) nose 6e, one can now present back surface Sb of specimen S to that same nose.

Figure 5:
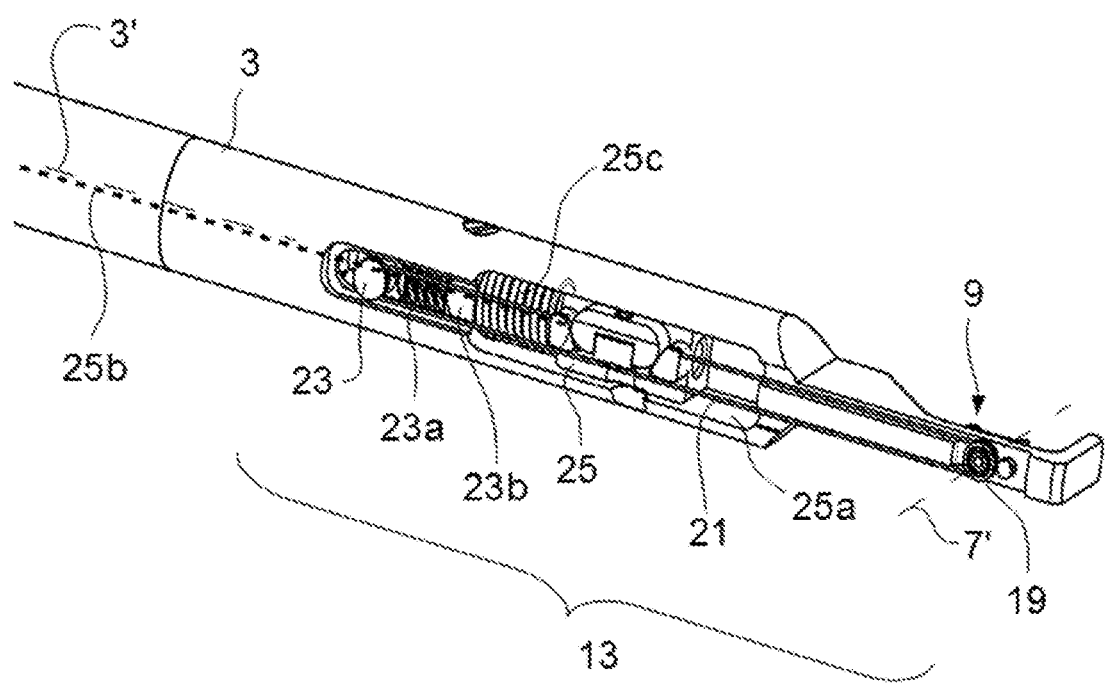
FIG. 5 shows a (detailed) magnified perspective view of part of the holder of FIG. 1.

Turning now to FIG. 5, this shows the following:

13: Driving means, which are connected to the rotor 7 (and, by extension, paddle 9) so as to effect the above-mentioned large-range Ry rotation (beta tilt). As here depicted, these driving means 13 comprise the components listed hereunder.

19: A driving wheel, which is connected/attached to rotor 7.

21: A tensioned driving belt. At one end, this driving belt 21 is run around driving wheel 19, whereas, at its other end, it is run around a tensioning wheel 23; the belt 21 is kept tensioned with the aid of tensioning spring 23a (connected to tensioning wheel 23), which abuts against stop 23b. Connected to the driving belt 21 is a slider block 25 that can slide back and forth (parallel to longitudinal axis 3') along a sliding surface 25a. This slider block 25 has an internally threaded bore (not shown) that engages with an externally threaded rod 25b (schematically depicted by a dashed line here), which passes through a hollow interior of elongated member 3 and is connected to an ex situ/remote rotational actuator (not shown). Backlash is mitigated by "pre-loading" the slider block 25 with the aid of biasing spring 25c. Alternatively, one could, for example, embody members 25/25c as a rack-and-pinion structure.

By actuating rod 25b, slider 25 is caused to slide back/forth, thereby causing belt 21 to move, with associated rotation (beta tilt) of driving wheel 19—and, by extension, rotor 7, paddle 9 and specimen S—about transverse axis 7'. With the set-up depicted here, such rotation can have a range of (at least) 360 degrees—though, for purposes of the present invention, a smaller rotational range (e.g. 180 degrees relative to the illustrated orientation/stance of paddle 9 parallel to the XY plane) can suffice.

In FIGS. 2-4, one should additionally note the gripping interface 17 on the paddle 9, which allows paddle 9 to be coupled to/decoupled from rotor 7 (see FIG. 4) using a mechanical gripper tool (not illustrated). As here depicted, this gripper interface 17 takes the form of a pair of depressions/hollows, which cooperate/engage with a corresponding pair of protrusions/bumps on the gripper tool.

As an indication of approximate sizing in the depicted embodiment:

The elongated member 3 has a length of the order of ca. 460 mm, and a diameter in the range of ca. 12-7 mm (tapering/stepping from thicker to thinner).

The flattened specimen mounting zone 5 has a thickness of the order of about 2 mm (in the Z direction of FIG. 1).

The paddle 9 has a thickness (perpendicular to Y) of ca. 1.9 mm. In FIG. 4, the combined length of the paddle 9 and stub 15b in the Y direction is ca. 3.2 mm, and the stub 15b had a diameter of ca. 0.6 mm.

Needless to say, these dimensions are not limiting, and are given for purposes of example only.

Embodiment 2

Figure 6:
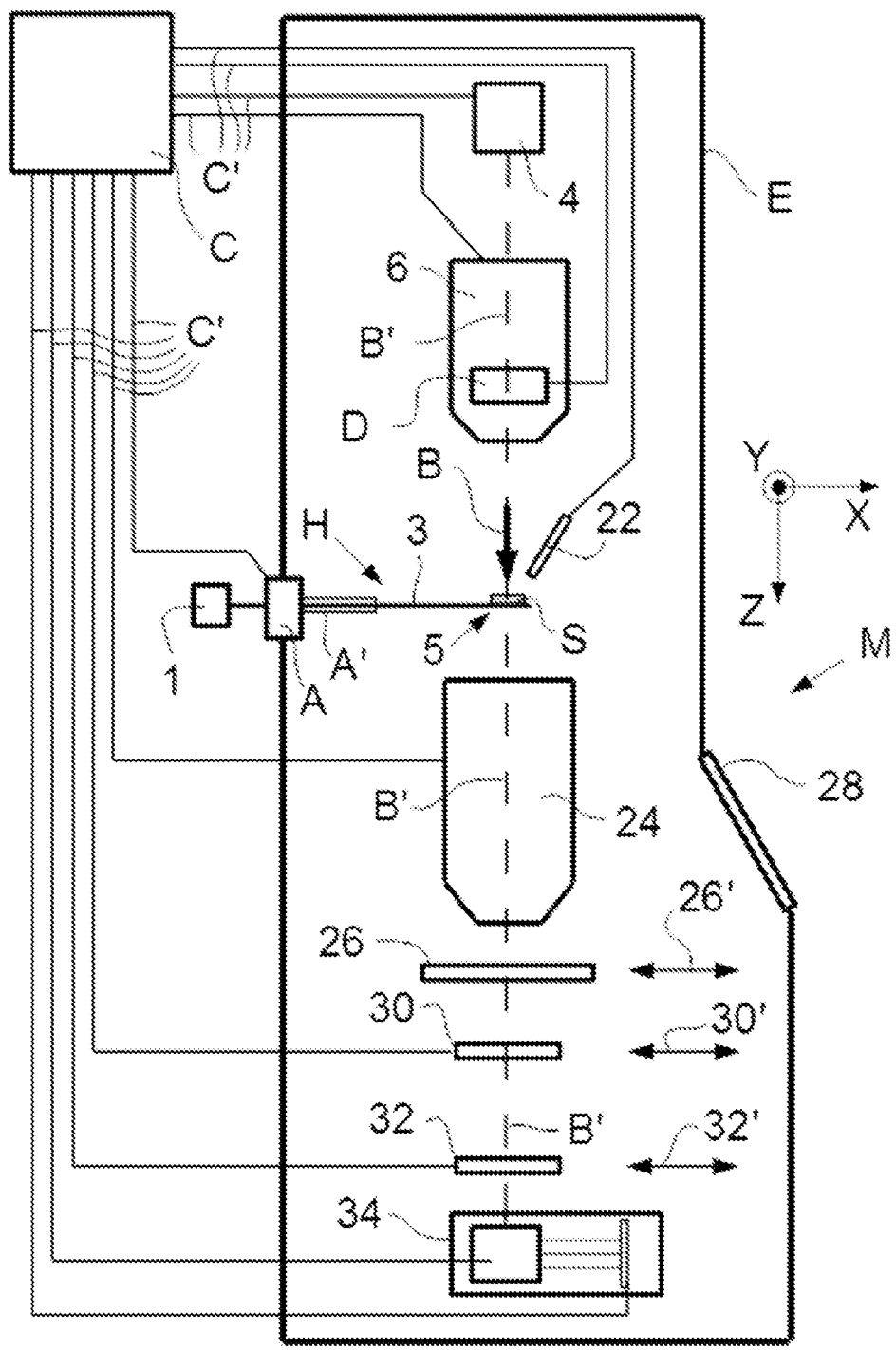
FIG. 6 renders an elevational view of an embodiment of a charged-particle microscope in which the current invention can be applied.

FIG. 6 is a highly schematic depiction of an embodiment of a CPM according to the current invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure E, an electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The specimen S is held on a specimen holder H according to the present invention, such as that depicted in FIGS. 1-5. As here illustrated, part of this holder H (inside enclosure E) is mounted in a cradle A' that can be positioned/moved in multiple degrees of freedom by a positioning device (stage) A; for example, the cradle A' may be displaced (inter alia) in the X, Y and Z directions (see the depicted Cartesian coordinate system), and may be rotated about a longitudinal axis 3' (see FIG. 1) parallel to X (roll, alpha tilt, Rx). Such movement allows, for example:

- Different parts of the specimen S to be irradiated/imaged/ inspected by the electron beam traveling along axis B';
- Selected parts of the specimen S to be machined by a (non-depicted) focused ion beam, for example (see items 6i and Bi' in FIG. 2);
- The specimen S to be tilted, e.g. during acquisition of a tilt series/sinogram in tomographic investigations;
- Scanning motion to be performed as an alternative to beam scanning (using deflector(s) D).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image/spectrum could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/ magnetic lenses, deflectors, correctors (such as stigmators), etc. In normal (non-scanning) TEM mode, this imaging system 24 can focus the transmitted electron flux onto a fluorescent screen 26, which, if desired, can be retracted/ withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of detector/analysis apparatus can be used downstream of screen 26, such as:

- TEM camera (detector) 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.
- STEM recorder (detector) 32. An output from recorder 32 can be recorded as a function of (X,Y) scanning position of the beam B on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).
- As an alternative to imaging using camera 30 or recorder 32, one can also invoke spectroscopic apparatus (detector) 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) C is connected to various illustrated components via control lines (buses) C'. This controller C can provide a variety of functions, such as synchronizing actions, providing setpoints, processing signals, performing calculations, and displaying messages/information on a display device (not depicted). Needless to say, the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/ STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, recorder 32, spectroscopic apparatus 34, etc.

It should be noted that, although the discussion above concentrates on a transmission-type CPM, the current invention is just as applicable in a non-transmission-type CPM, such as a SEM.

The invention claimed is:

1. A specimen holder for a Charged Particle Microscope, comprising:
   a support structure;
   an elongated member, a first end of which is connected to said support structure and the second end of which comprises a specimen mounting zone, the member having a longitudinal axis that extends along its length between said first and second ends,
   the specimen mounting zone comprising:
   a rotor that is rotatable about a transverse axis extending substantially perpendicular to said longitudinal axis;
   a paddle connected to said rotor so as to be rotatable about said transverse axis, the paddle comprising a specimen mounting area; and
   driving means connected to said rotor, which can be invoked to rotate said paddle through a rotational range that allows the paddle to be inverted relative to an initial orientation thereof.

2. A specimen holder according to claim 1, wherein:
said longitudinal and transverse axes are located in a reference plane;
said transverse axis intersects said paddle at a first edge of the paddle; and
a second edge of the paddle, opposite said first edge, is at least partially accessible without obstruction within said reference plane.

3. A specimen holder according to claim 1, wherein said paddle is detachably connected to said rotor via a releasable coupling.

4. A specimen holder according to claim 3, wherein said paddle is provided with a gripping interface that allows it to be mounted to and demounted from said rotor using a mechanical gripper tool.

5. A specimen holder according to claim 1, wherein said driving means comprise:
a driving wheel connected to said rotor;
an actuator located remote from said rotor;
connecting means connecting said actuator to said driving wheel, which connecting means comprise a tensioned driving belt.

6. A method of using a Charged Particle Microscope, comprising the following steps:
providing a specimen on a specimen holder;
directing a beam of charged particles along a particle-optical axis so as to irradiate the specimen;
the specimen holder comprising:
a support structure;
an elongated member, a first end of which is connected to said support structure and the second end of which comprises a specimen mounting zone, the member having a longitudinal axis that extends along its length between said first and second ends;
a rotor that is rotatable about a transverse axis extending substantially perpendicular to said longitudinal axis;
a paddle connected to said rotor so as to be rotatable about said transverse axis, the paddle comprising a specimen mounting area; and
driving means connected to said rotor, which can be invoked to rotate said paddle through a rotational range that allows the paddle to be inverted relative to an initial orientation thereof.

7. A method according to claim 6, wherein:
in a first irradiation session, charged particles are directed at a front side of the specimen while the paddle has said initial orientation;
said paddle is inverted about said transverse axis;
in a second irradiation session, charged particles are directed at a back side of the specimen while the paddle is inverted.

8. A method according to claim 6, wherein said elongated member is rotated about said longitudinal axis so as to adjust a stance of the specimen relative to said particle-optical axis.

9. A method according to claim 6, wherein a combination of:
rotation of said paddle about said transverse axis;
rotation of said elongated member about said longitudinal axis,
is used to sequentially orient said specimen relative to at least two components selected from the group comprising:
an electron beam;
an ion beam;
a micromanipulator; and
a gas injection nozzle,
as part of a procedure to perform at least one of the following processes:
mount the specimen on said specimen holder; and
alter a surface of the specimen.

10. A Charged Particle Microscope, comprising:
a specimen holder, for holding a specimen;
a source, for producing a beam of charged particles;
an illuminator, for directing said beam so as to irradiate the specimen;
a detector, for detecting a flux of radiation emanating from the specimen in response to said irradiation;
which specimen holder is a specimen holder as claimed in claim 1.

11. A charged particle microscope according to claim 10, wherein:
said longitudinal and transverse axes are located in a reference plane;
said transverse axis intersects said paddle at a first edge of the paddle; and
a second edge of the paddle, opposite said first edge, is at least partially accessible without obstruction within said reference plane.

12. A charged particle microscope according to claim 10, wherein said paddle is detachably connected to said rotor via a releasable coupling.

13. A charged particle microscope according to claim 12, wherein said paddle is provided with a gripping interface that allows it to be mounted to and demounted from said rotor using a mechanical gripper tool.

14. A charged particle microscope according to claim 10, wherein said actuator comprises:
a driving wheel connected to said rotor;
an actuator located remote from said rotor; and
connecting means connecting said actuator to said driving wheel, which connecting means comprise a tensioned driving belt.

15. A specimen holder according to 2, wherein said paddle is detachably connected to said rotor via a releasable coupling.

16. A specimen holder according to claim 15, wherein said paddle is provided with a gripping interface that allows it to be mounted to and demounted from said rotor using a mechanical gripper tool.

17. A specimen holder according to claim 2, wherein said driving means comprise:
a driving wheel connected to said rotor;
an actuator located remote from said rotor; and
a tensioned driving belt connecting said actuator to said driving wheel.

18. A specimen holder according to claim 3, wherein said driving means comprise:
a driving wheel connected to said rotor;
an actuator located remote from said rotor; and
a tensioned driving belt connecting said actuator to said driving wheel.

19. A method according to claim 7, wherein said elongated member is rotated about said longitudinal axis so as to adjust a stance of the specimen relative to said particle-optical axis.

20. A method according to claim 7, wherein a combination of:
rotation of said paddle about said transverse axis;
rotation of said elongated member about said longitudinal axis,
is used to sequentially orient said specimen relative to at least two components selected from the group comprising:

an electron beam;
an ion beam;
a micromanipulator; and
a gas injection nozzle;
as part of a procedure to perform at least one of the following processes:
mount the specimen on said specimen holder; and
alter a surface of the specimen.

* * * * *